(12) United States Patent
Cho et al.

(10) Patent No.: US 6,677,216 B2
(45) Date of Patent: Jan. 13, 2004

(54) METHOD OF MAKING IC CAPACITOR

(75) Inventors: Chun-Pey Cho, Hsinchu (TW);
Tsai-Sen Lin, Hsinchu (TW);
Chou-Shin Jou, Hsinchu (TW);
Chuan-Yi Wang, Hsinchu (TW);
Jen-Chieh Chang, Hsinchu (TW);
Yi-Fu Chung, Hsinchu (TW);
Huei-Ping Hsieh, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/263,397

(22) Filed: Oct. 1, 2002

(65) Prior Publication Data

US 2003/0068868 A1 Apr. 10, 2003

(30) Foreign Application Priority Data

Oct. 4, 2001 (TW) ......................... 90124499 A
Apr. 23, 2002 (TW) ......................... 91108356 A

(51) Int. Cl.$^7$ ..................... H01L 21/20; H01L 21/8242
(52) U.S. Cl. ................... 438/381; 438/239; 438/250; 438/253; 438/393; 438/396; 438/952
(58) Field of Search ................... 438/238, 239, 438/250, 253, 381, 393, 396, 952

(56) References Cited

U.S. PATENT DOCUMENTS

| | | | | |
|---|---|---|---|---|
| 5,356,826 A | * | 10/1994 | Natsume ..................... | 438/238 |
| 5,418,398 A | * | 5/1995 | Sardella et al. ............ | 257/775 |
| 5,580,701 A | * | 12/1996 | Lur et al. ................... | 430/316 |
| 5,604,157 A | * | 2/1997 | Dai et al. ................... | 438/297 |
| 5,837,576 A | * | 11/1998 | Chen et al. ................. | 438/253 |
| 5,846,878 A | * | 12/1998 | Horiba ....................... | 438/636 |
| 6,133,618 A | * | 10/2000 | Steiner ....................... | 257/646 |
| 6,171,899 B1 | * | 1/2001 | Liou et al. .................. | 438/240 |
| 6,184,551 B1 | * | 2/2001 | Lee et al. ................... | 257/310 |
| 6,211,034 B1 | * | 4/2001 | Visokay et al. ............ | 438/396 |
| 6,215,142 B1 | * | 4/2001 | Lee et al. ................... | 257/301 |
| 2003/0008467 A1 | * | 1/2003 | Kai et al. ................... | 438/393 |
| 2003/0008468 A1 | * | 1/2003 | Park ............................ | 438/393 |
| 2003/0022433 A1 | * | 1/2003 | Ejiri ........................... | 438/240 |
| 2003/0067053 A1 | * | 4/2003 | Hori et al. .................. | 257/532 |
| 2003/0068858 A1 | * | 4/2003 | Allman et al. ............. | 438/253 |

* cited by examiner

*Primary Examiner*—Mary Wiczewski
*Assistant Examiner*—Toniae M. Thomas
(74) *Attorney, Agent, or Firm*—Townsend and Townsend and Crew LLP

(57) ABSTRACT

Embodiments of the present invention relate to a method of making an IC capacitor. In one embodiment, the method comprises providing a substrate, forming a polycide layer on the substrate, and forming an insulating amorphous silicon layer on the polycide layer. The insulating amorphous silicon layer serves as an anti-reflection layer. The method further comprises implanting n-type ions into the insulating amorphous silicon layer to transform the insulating amorphous silicon layer into a conductive amorphous silicon layer, and patterning the polycide layer and the conductive amorphous silicon layer to form a bottom electrode on the substrate. A dielectric layer is formed on the bottom electrode and the substrate, and a conductor layer is formed on the dielectric layer. The conductor layer is patterned to form a top electrode on the dielectric layer.

25 Claims, 6 Drawing Sheets

METHOD OF MAKING IC CAPACITOR

CROSS-REFERENCES TO RELATED APPLICATIONS

This application claims priority from R.O.C. Patent Application No. 090124499, filed Oct. 4, 2001, and No. 091108356, filed Apr. 23, 2002, the entire disclosures of which are incorporated herein by reference.

BACKGROUND OF THE INVENTION

The present invention relates to semiconductor manufacturing processes and, more particularly, to a method of making an IC capacitor.

In the traditional IC (integrated circuit) capacitor fabrication process of semiconductor manufacture, particularly the fabrication process of the digital mixing IC capacitor and the LCD driving IC capacitor, a bottom anti-reflection layer (BARC) is usually coated on the bottom electrode of the capacitor. The anti-reflection layer can prevent the occurrence of standing waves effect during photolithography, thus maintaining the profile of the bottom electrode of the capacitor.

Additionally, in order to enhance the conductivity, "polycide" is commonly used as the material of the bottom electrode of the capacitor. When an amorphous silicon ($\alpha$-Si) layer serves as the anti-reflection layer in the fabrication process of the capacitor, the amorphous silicon layer reduces the conductivity of the bottom electrode, which affects the stability and reliability of the capacitor.

Lur et al. (U.S. Pat. No. 5,580,701) disclose that a silicon oxide layer, a silicon oxynitride layer, a silicon nitride layer or an amorphous silicon layer serves as the anti-reflection layer to eliminate standing waves in the photoresist layer of VLSI devices. The disclosed method, however, does not teach how to solve the conductivity problem mentioned previously.

BRIEF SUMMARY OF THE INVENTION

Embodiments of the present invention relate to a method of making an IC capacitor. In specific embodiments, the method improves the stability of the IC capacitor. The method can also improve the conductivity of the bottom electrode of the IC capacitor.

In accordance with an aspect of the present invention, a method of making an IC capacitor comprises providing a substrate, forming a polycide layer on the substrate, and forming an insulating amorphous silicon layer on the polycide layer. The insulating amorphous silicon layer serves as an anti-reflection layer. The method further comprises implanting n-type ions into the insulating amorphous silicon layer to transform the insulating amorphous silicon layer into a conductive amorphous silicon layer, and patterning the polycide layer and the conductive amorphous silicon layer to form a bottom electrode on the substrate. A dielectric layer is formed on the bottom electrode and the substrate, and a conductor layer is formed on the dielectric layer. The conductor layer is patterned to form a top electrode on the dielectric layer.

In some embodiments, the polycide layer comprises doped polysilicon and tungsten silicon ($WSi_x$). The insulating amorphous silicon layer is formed by deposition. The n-type ions comprise $As^+$. The n-type ions are implanted with about 10–20 keV of energy and more than about 1E14 atom/cm$^2$ of dosage. The dielectric layer comprises a silicon oxide layer formed by deposition.

In accordance with another aspect of the invention, a method of making an IC capacitor comprises providing a substrate, forming a doped polysilicon layer on the substrate, forming a silicide layer on the doped polysilicon layer, and forming a conductive amorphous silicon layer serving as an anti-reflection layer on the silicide layer. A bottom electrode comprises the doped polysilicon layer, the silicide layer and the conductive amorphous silicon layer. The method further comprises forming a dielectric layer on the bottom electrode, and forming a top electrode on the dielectric layer.

In some embodiments, the conductive amorphous silicon layer is formed by CVD from $SiH_4$ gas and $PH_3$ gas. The $SiH_4$ gas and $PH_3$ gas are in-situ introduced at a flow rate of about 190 sccm for the $SiH_4$ gas and a flow rate of about 25 sccm for the $PH_3$ gas. The CVD is performed at a temperature of about 550±15° C., and at a pressure of about 0.3±0.1 torr. The conductive amorphous silicon layer has a thickness of about 100–300 angstroms. The doped polysilicon layer has a sheet resistance of about 30–100 $\Omega/\square$, and the silicide has a sheet resistance of about 0.1–1 $\Omega/\square$. The conductive amorphous silicon layer has a sheet resistance of about 30–100 $\Omega/\square$. A polycide layer is composed of the doped polysilicon layer and the silicide layer. The variation in sheet resistance between the conductive amorphous silicon layer and the polycide layer is within about 30 $\Omega/\square$.

According to specific embodiments of the present invention, the IC capacitor has a conductive amorphous silicon layer which serves as an anti-reflection layer. The invention can improve the stability of the IC capacitor, thereby raising reliability and yield, and ameliorating the disadvantages of the prior art.

DETAILED DESCRIPTION OF THE INVENTION

FIGS. 1–7 are sectional diagrams of a semiconductor device illustrating the formation of an IC capacitor according to the first embodiment of the present invention.

Figure 1:
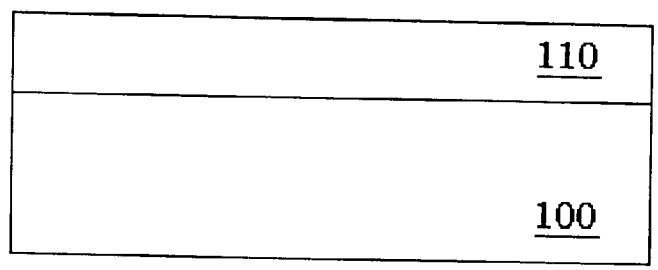
FIGS. 1–7 are cross-sectional diagrams of a semiconductor device illustrating the formation of an IC capacitor according to the first embodiment of the present invention.

FIG. 1, a polycide layer 110 is formed on a substrate 100. The substrate 100 may be a semiconductor substrate, such as a silicon substrate. The polycide layer 110 may, for example, include a doped polysilicon layer (not shown) and a tungsten silicon ($WSi_x$) layer (not shown). The sheet resistance of the polycide layer 110 is about 30–100 $\Omega/\square$.

Figure 2:
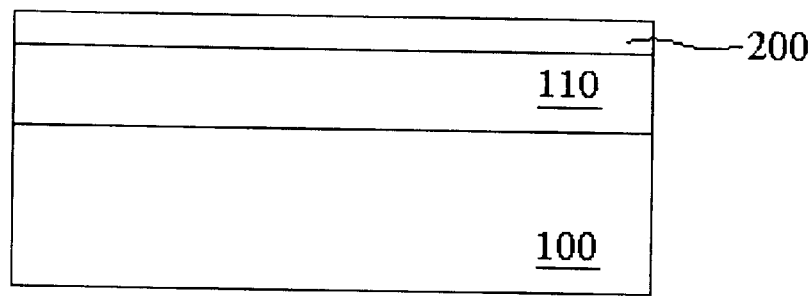

In FIG. 2, an insulating amorphous silicon layer 200 is formed on the polycide layer 110, where the insulating amorphous silicon layer 200 serves as a bottom anti-reflection layer. The method of forming the insulating amorphous silicon layer 200 may be, for example, CVD. The thickness of the insulating amorphous silicon layer 200 is typically about 100–300 angstroms. The resistance of the insulating amorphous silicon layer 200 is nearly infinity, so the insulating amorphous silicon layer 200 seriously decreases the stability performance of the capacitance and the oscillation frequency of the IC capacitor that is being formed.

Figure 3:
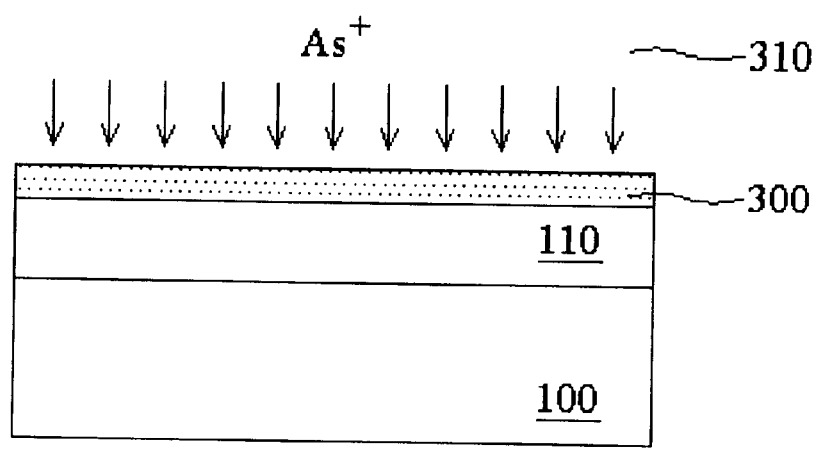

In FIG. 3, an n-type ion implantation 310 is performed on the insulating amorphous silicon layer 200 to transform the insulating amorphous silicon layer 200 transfer into a conductive amorphous silicon layer 300. The n-type ion implantation 310 may be, for example, $As^+$ implantation or $P^+$ implantation. It is generally preferred to use $As^+$ implantation because the ion volume of $As^+$ is greater than the other. When performing the implantation 310 or subsequent heat treatment, $As^+$ is too large to diffuse into the polycide layer 110 so that it will not affect the character of bottom electrode of the capacitor. Moreover, since the thickness of the insulating amorphous silicon layer 200 is very thin, the power of the n-type ion implantation 310 can be low (e.g., 10–20 keV) and the dosage of the $As^+$ can be high (e.g., $\geq 1E14$ atom/cm$^2$). Thus, the conductive amorphous silicon layer 300 whose sheet resistance is typically about 200–300 $\Omega/\square$, similar to the sheet resistance of the polycide layer 110, is formed.

Figure 4:
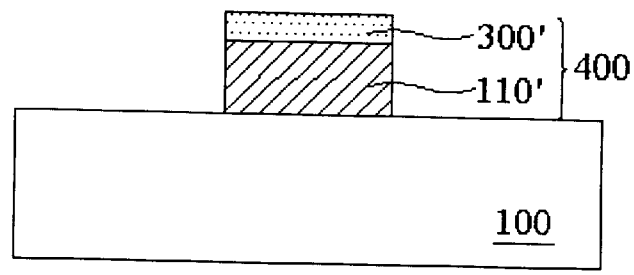

In FIG. 4, the polycide layer 110 and the conductive amorphous silicon layer 300 are patterned to form a bottom electrode 400 on the substrate 100. That is, the bottom electrode 400 is composed of a patterned polycide layer 110' and a patterned conductive amorphous silicon layer 300'. The method of patterning the polycide layer 110' and the conductive amorphous silicon layer 300' may, preferably, be anisotropic dry etching. The etching gas of the dry etching typically includes $Cl_2$ and HBr.

Figure 5:
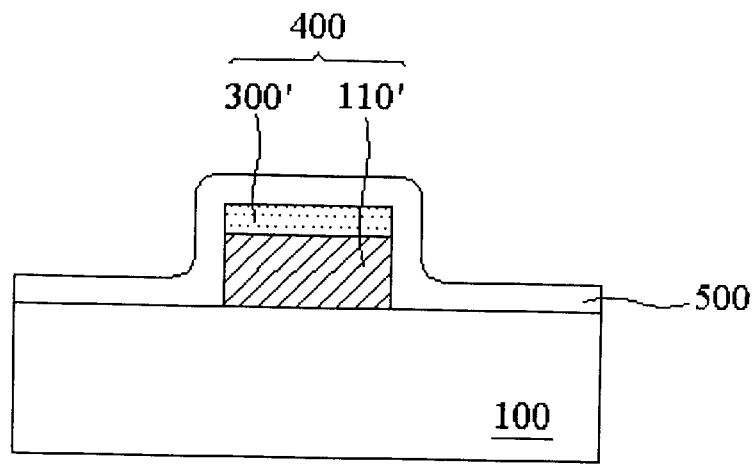

In FIG. 5, a conformal dielectric layer 500 is formed on the bottom electrode 400 and the substrate 100. The dielectric layer 500 may be a $SiO_2$ layer formed by CVD.

Figure 6:
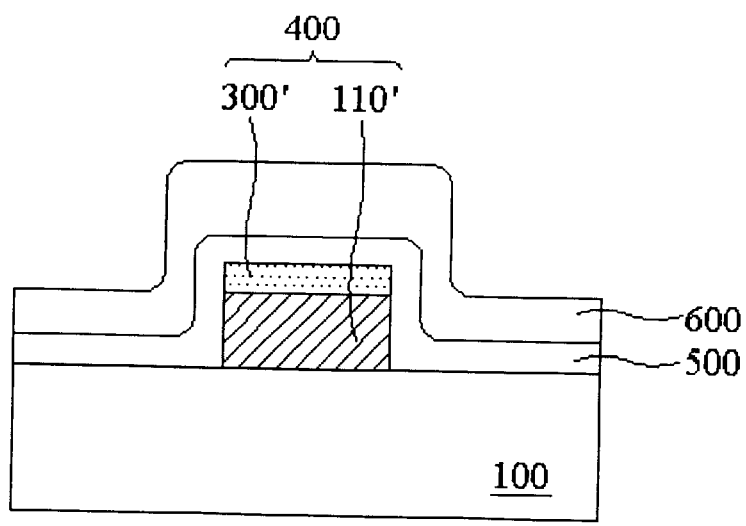

In FIG. 6, a conformal conductor layer 600 is formed on the dielectric layer 500. The conductor layer 600 may be a doped polysilicon layer formed by CVD. For example, a polysilicon layer is deposited on the dielectric layer 500, and then the polysilicon layer is heavily implanted with phosphorous ions.

Figure 7:
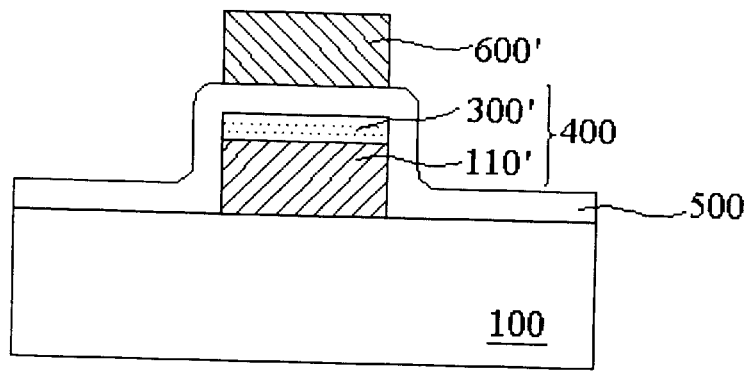

In FIG. 7, the conductor layer 600 is patterned to form a top electrode 600' on the dielectric layer 500. The method of patterning the conductor layer 600' may, preferably, be anisotropic dry etching. The etching gas of the dry etching typically includes $Cl_2$ and HBr.

As a demonstrative example, when using 15 keV for energy and 1E15 atom/cm2 for $As^+$ dosage as the conditions of the n-type ion implantation 310, the parasitic resistance of the conductive amorphous silicon layer 300 under the frequency of 100 kHz is 700 $\Omega$ and the parasitic resistance of the conductive amorphous silicon layer 300 under the frequency of 1 MHz is 600.5 $\Omega$. That is, the character of the conductive amorphous silicon layer 300 according to the first embodiment of the present invention is stable, irrespective of the operating frequency.

Consequently, according to the first embodiment of the present invention, an IC capacitor comprises the bottom electrode 400 having the patterned polycide layer 110' and a patterned conductive amorphous silicon layer 300', the dielectric layer 500, and the top electrode 600'.

FIGS. 8–13 are sectional diagrams of a semiconductor device illustrating the formation of an IC capacitor according to the second embodiment of the present invention.

Figure 8:
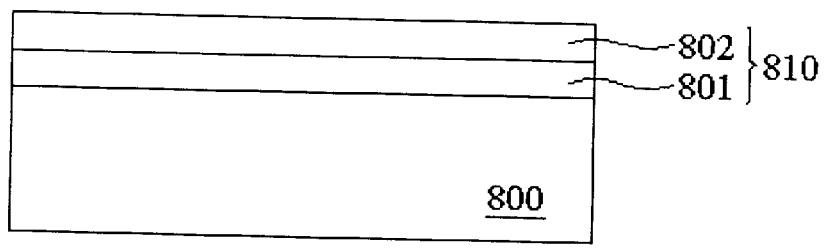
FIGS. 8–13 are cross-sectional diagrams of a semiconductor device illustrating the formation of an IC capacitor according to the second embodiment of the present invention.

In FIG. 8, a doped polysilicon layer 801 is formed on a substrate 800. A silicide layer 802 is formed on the doped polysilicon layer 801. The stack structure of the doped polysilicon layer 801 and the silicide layer 802 is called a polycide layer 810. The substrate 800 may be a semiconductor substrate, such as a silicon substrate. The doped polysilicon layer 801 may be, for example, a polysilicon layer implanted with $As^+$ or $P^+$. The silicide layer 802 may be, for example, a tungsten silicon ($WSi_x$) layer formed by CVD. The thickness of the doped polysilicon layer 801 is typically about 1000–3000 angstroms. The sheet resistance of the doped polysilicon layer 801 is typically about 30–100 $\Omega/\square$. The thickness of the silicide layer 802 is about 1000–2000 angstroms. The sheet resistance of the silicide layer 802 is about 0.1–1 $\Omega/\square$.

Figure 9:
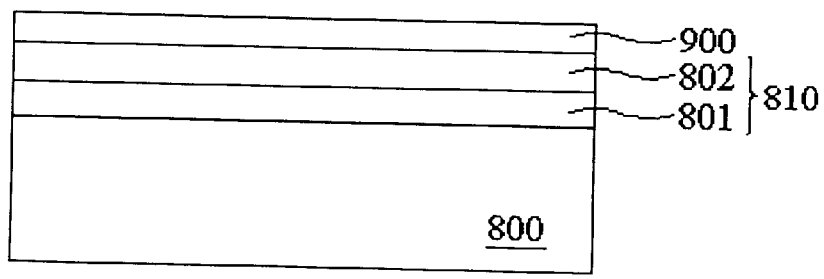

In FIG. 9, a conductive amorphous silicon layer 900 serving as a bottom anti-reflection layer and typically having a thickness of about 100–300 angstroms is formed on the suicide layer 802. The sheet resistance of the conductive amorphous silicon layer 900 is about 30–100 $\Omega/\square$, similar to the sheet resistance of the doped polysilicon layer 801. Additionally, the variation in sheet resistance between the conductive amorphous silicon layer 900 and the first polycide layer 810 is within about 30 $\Omega/\square$.

Figure 9A:
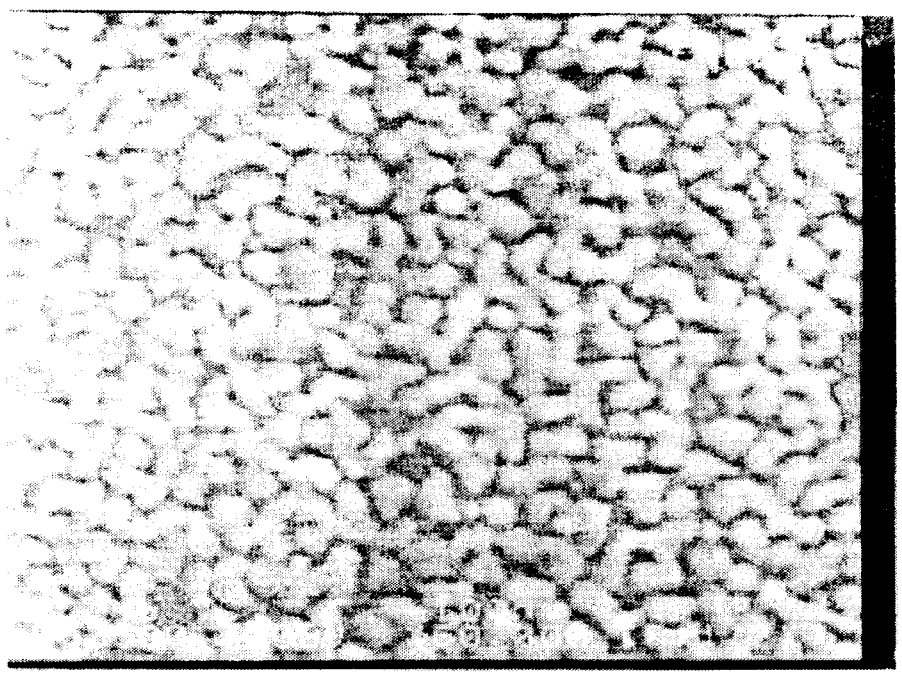

The method of forming the conductive amorphous silicon layer 900 comprises CVD in which $SiH_4$ gas and $PH_3$ gas are in-situ introduced. The flow rate of $SiH_4$ gas is about 190 sccm and the flow rate of $PH_3$ gas is about 25 sccm. The temperature of the CVD is controlled at about 550±15° C. The pressure of the CVD is controlled at about 0.3±0.1 torr. Thus, the conductive amorphous silicon layer 900 having a thickness of about 100–300 angstroms and a sheet resistance of about 30–100 $\Omega/\square$ is obtained. It should be noted that the chemical reaction of $SiH_4$ and $PH_3$ is not completed when the CVD temperature is below about 535° C., causing particle contamination. Contrarily, when the CVD temperature is over about 565° C., the surface of the conductive amorphous silicon layer 900 becomes rough, interfering with forming the smooth and thin anti-reflection layer. It should be noted that the chemical reaction of $SiH_4$ and $PH_3$ is not completed when the CVD temperature is below about 535° C., causing particle contamination on the furnace tube. Contrarily, when the CVD temperature is over about 565° C., the surface of the conductive amorphous silicon layer 900 becomes rough, interfering with forming the smooth and thin anti-reflection layer. As an example, the SEM picture in FIG. 9A shows the rough surface of the conductive amorphous silicon layer 900 at the temperature 572° C.

Figure 10:
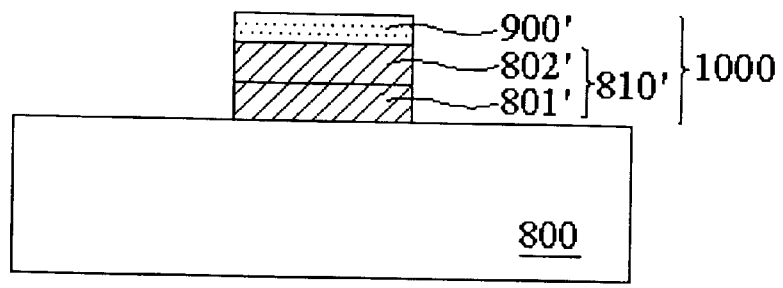

In FIG. 10, the polycide layer 810 and the conductive amorphous silicon layer 900 are patterned to form a bottom electrode 1000 on the substrate 800. That is, the bottom electrode 1000 is composed of a patterned polycide layer 810' and a patterned conductive amorphous silicon layer 900'. The patterned polycide layer 810' includes a patterned doped polysilicon layer 801' and a patterned silicide layer 802'. The method of patterning the first polycide layer 810' and the conductive amorphous silicon layer 900' may, preferably, be anisotropic dry etching. The etching gas of the dry etching typically includes $Cl_2$ and HBr. Because the sheet resistance of the patterned conductive amorphous silicon layer 900' is similar to the sheet resistance of the patterned doped polysilicon layer 801', and the variation in sheet resistance between the patterned conductive amorphous silicon layer 900' and the patterned polycide layer 810' is within about 30 $\Omega/\square$, the conductive character of the IC capacitor is more stable than that of the prior art.

Figure 11:
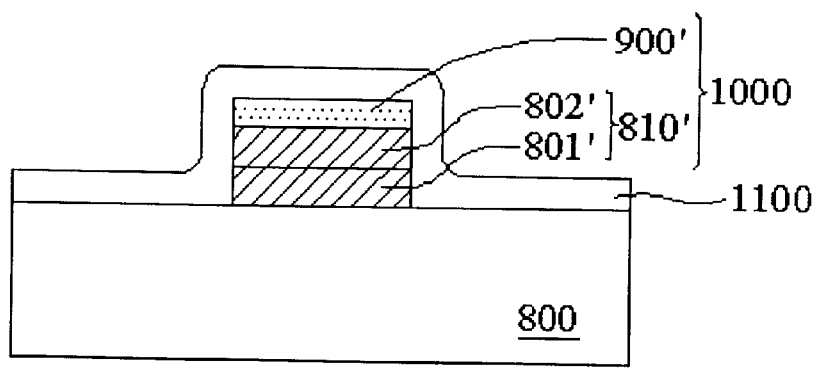

In FIG. 11, a conformal dielectric layer 1100 is formed on the bottom electrode 1000 and the substrate 800. The dielectric layer 1100 may be a $SiO_2$ layer formed by CVD.

Figure 12:
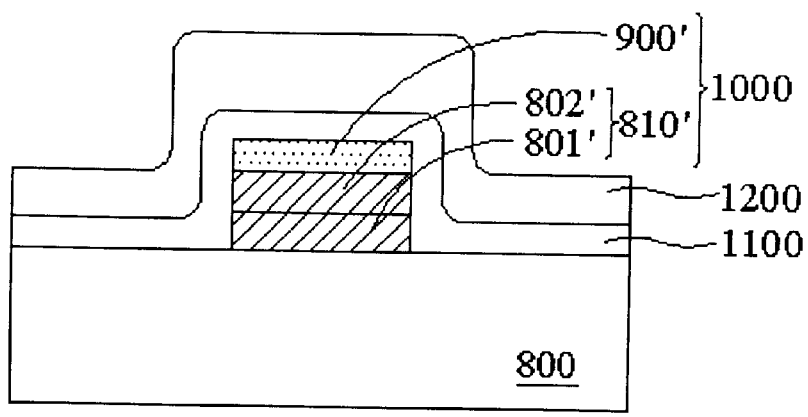

In FIG. 12, a conformal conductor layer 1200 is formed on the dielectric layer 1100. The conductor layer 1200 may be a doped polysilicon layer formed by CVD. For example, a polysilicon layer is deposited on the dielectric layer 1100, and then the polysilicon layer is heavily implanted with phosphorous ions.

Figure 13:
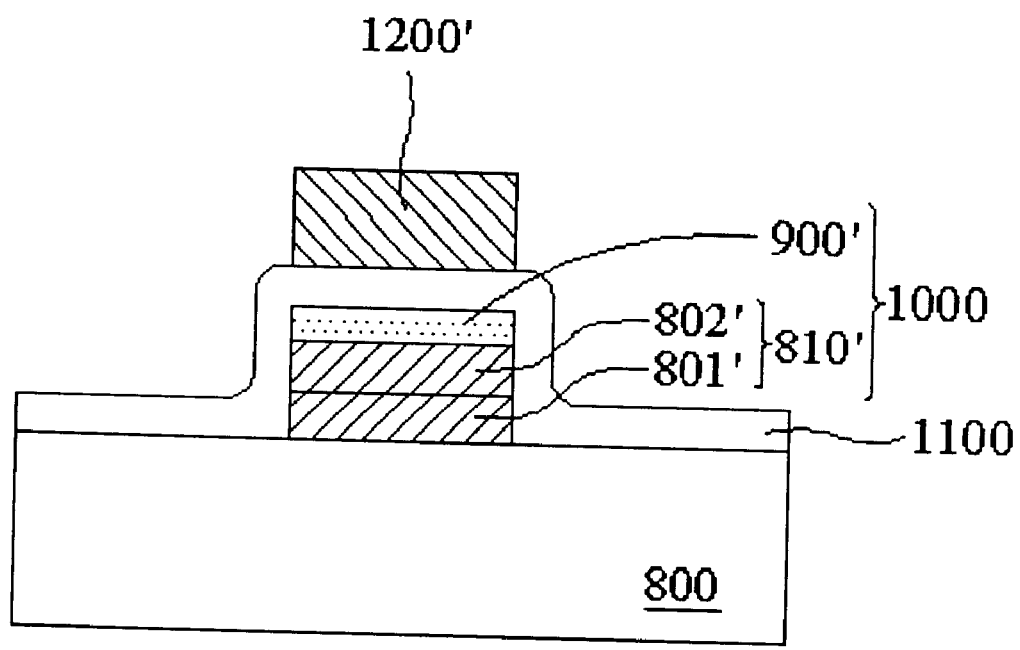

In FIG. 13, the conductor layer 1200 is patterned to form a top electrode 1200' on the dielectric layer 1100. The method of patterning the second polycide layer 1100 may, preferably, be anisotropic dry etching. The etching gas of the dry etching typically includes $Cl_2$ and HBr.

Consequently, according to the second embodiment of the present invention, an IC capacitor comprises the bottom electrode 1000 having the patterned polycide layer 810' and a patterned conductive amorphous silicon layer 900', the dielectric layer 1100, and the top electrode 1200'.

Thus, the present invention provides a method for the formation of IC capacitor with a conductive amorphous silicon layer, wherein the conductive amorphous silicon layer serves as a bottom anti-reflection layer. The present invention significantly improves the reliability of the product. Additionally, the present invention eliminates the standing waves effect during photolithography, thereby maintaining the profile of the IC capacitor.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A method of making an IC capacitor, the method comprising:
   providing a substrate;
   forming a polycide layer on the substrate;
   forming an insulating amorphous silicon layer on the polycide layer, wherein the insulating amorphous silicon layer serves as an anti-reflection layer;
   implanting n-type ions into the insulating amorphous silicon layer to transform the insulating amorphous silicon layer into a conductive amorphous silicon layer;
   patterning the polycide layer and the conductive amorphous silicon layer to form a bottom electrode on the substrate;
   forming a dielectric layer on the bottom electrode and the substrate;
   forming a conductor layer on the dielectric layer; and
   patterning the conductor layer to form a top electrode on the dielectric layer.

2. The method according to claim 1, wherein the polycide layer comprises doped polysilicon and tungsten silicon ($WSi_x$).

3. The method according to claim 1, wherein the insulating amorphous silicon layer is formed by deposition.

4. The method according to claim 1, wherein the n-type ions comprise $As^+$.

5. The method according to claim 4, wherein the n-type ions are implanted with about 10–20 keV of energy and more than about 1E14 atom/$cm^2$ of dosage.

6. The method according to claim 5, wherein the n-type ions are implanted with about 15 keV of energy and about 1E15 atom/$cm^2$ of dosage.

7. The method according to claim 1, wherein the dielectric layer comprises a silicon oxide layer formed by deposition.

8. A method of making an IC capacitor, the method comprising:
   providing a substrate;
   forming a doped polysilicon layer on the substrate;
   forming a silicide layer on the doped polysilicon layer;
   forming a conductive amorphous silicon layer serving as an anti-reflection layer on the silicide layer, wherein a bottom electrode comprises the doped polysilicon layer, the suicide layer and the conductive amorphous silicon layer;
   forming a dielectric layer on the bottom electrode; and
   forming a top electrode on the dielectric layer.

9. The method according to claim 8, wherein the conductive amorphous silicon layer is formed by CVD from $SiH_4$ gas and $PH_3$ gas.

10. The method according to claim 9, wherein the $SiH_4$ gas and $PH_3$ gas are in-situ introduced at a flow rate of about 190 sccm for the $SiH_4$ gas and a flow rate of about 25 sccm for the $PH_3$ gas.

11. The method according to claim 9, wherein the CVD is performed at a temperature of about 505±15° C.

12. The method according to claim 9, wherein the CVD is performed at a pressure of about 0.3±0.1 torr.

13. The method according to claim 9, wherein the conductive amorphous silicon layer has a thickness of about 100–300 angstroms.

14. The method according to claim 8, wherein the doped polysilicon layer has a sheet resistance of about 30–100 $\Omega/\square$, and the silicide has a sheet resistance of about 0.1–1 $\Omega/\square$.

15. The method according to claim 14, wherein the conductive amorphous silicon layer has a sheet resistance of about 30–100 $\Omega/\square$.

16. The method according to claim 8, wherein a polycide layer is composed of the doped polysilicon layer and the silicide layer.

17. The method according to claim 16, wherein a variation in sheet resistance between the conductive amorphous silicon layer and the polycide layer is within about 30 $\Omega/\square$.

18. A method of making an IC capacitor, the method comprising:
   providing a substrate;
   forming a doped polysilicon layer on the substrate;
   forming a silicide layer on the doped polysilicon layer;
   performing CVD in which $SiH_4$ gas and $PH_3$ gas are in-situ introduced to form a conductive amorphous silicon layer serving as an anti-reflection layer and having a thickness of between about 100–300 angstroms on the silicide layer, wherein a bottom electrode comprises the doped polysilicon layer, the silicide layer and the conductive amorphous silicon layer;
   forming a dielectric layer on the bottom electrode; and
   forming a top electrode on the dielectric layer.

19. The method according to claim 18, wherein the $SiH_4$ gas is introduced at a flow rate of about 190 sccm and the $PH_3$ gas is introduced at a flow rate of about 25 sccm.

20. The method according to claim 18, wherein the CVD is performed at a temperature of about 550±15° C.

21. The method according to claim 18, wherein the CVD is performed at a pressure of about 0.3±0.1 torr.

22. The method according to claim 18, wherein the doped polysilicon layer has a sheet resistance of about 30–100 $\Omega/\square$, and the silicide has a sheet resistance of about 0.1–1 $\Omega/\square$.

23. The method according to claim 22, wherein the conductive amorphous silicon layer has a sheet resistance of about 30–100 $\Omega/\square$.

24. The method according to claim 18, wherein a polycide layer is composed of the doped polysilicon layer and the silicide layer.

25. The method according to claim 24, wherein a variation in sheet resistance between the conductive amorphous silicon layer and the polycide layer is within about 30 $\Omega/\square$.

* * * * *